United States Patent
Gregory et al.

(10) Patent No.: US 10,989,748 B2
(45) Date of Patent: *Apr. 27, 2021

(54) APPARATUS AND METHODS FOR TESTING DEVICES

(71) Applicant: Micron Technology, Inc., Boise, ID (US)

(72) Inventors: Paul E. Gregory, Boise, ID (US); Randon K. Richards, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/931,912

(22) Filed: Jul. 17, 2020

(65) Prior Publication Data
US 2020/0348349 A1    Nov. 5, 2020

Related U.S. Application Data

(63) Continuation of application No. 15/606,109, filed on May 26, 2017, now Pat. No. 10,718,805.

(60) Provisional application No. 62/349,939, filed on Jun. 14, 2016.

(51) Int. Cl.
G01R 31/00   (2006.01)
G01R 31/44   (2020.01)
G01R 1/067   (2006.01)

(52) U.S. Cl.
CPC ....... *G01R 31/001* (2013.01); *G01R 1/06705* (2013.01); *G01R 31/002* (2013.01); *G01R 31/44* (2013.01)

(58) Field of Classification Search
CPC .. G01R 31/2635; G09G 3/006; G09G 3/3233; G09G 2330/12; H04N 9/3191
See application file for complete search history.

(56) References Cited

U.S. PATENT DOCUMENTS

| | | | |
|---|---|---|---|
| 6,360,621 B1 | 3/2002 | Eldred et al. | |
| 6,861,856 B2* | 3/2005 | Dunklee | G01R 31/2886 324/754.03 |
| 2003/0117787 A1* | 6/2003 | Nakauchi | H05K 1/0218 361/818 |

(Continued)

FOREIGN PATENT DOCUMENTS

| CN | 202949428 U | 5/2013 |
|---|---|---|
| CN | 104280626 A | 1/2015 |

(Continued)

OTHER PUBLICATIONS

Decision of Rejection from related Taiwanese patent application No. 106119654, dated Sep. 17, 2018, 9 pp.

(Continued)

*Primary Examiner* — Tung X Nguyen
(74) *Attorney, Agent, or Firm* — Brooks, Cameron & Huebsch, PLLC

(57) ABSTRACT

The present disclosure includes apparatuses and methods related to test devices, for example testing devices by measuring signals emitted by a device. One example apparatus can include a first portion including a number of sidewalls positioned to at least partially surround a device under test; and a second portion electrically coupled to the first portion, wherein the second portion is configured to move in the x-direction, the y-direction, and z-direction.

18 Claims, 3 Drawing Sheets

(56) References Cited

U.S. PATENT DOCUMENTS

| | | |
|---|---|---|
| 2009/0108862 A1 | 4/2009 | Ni |
| 2011/0031009 A1 | 2/2011 | Leegate et al. |
| 2014/0020946 A1 | 1/2014 | Winch et al. |
| 2015/0109941 A1 | 4/2015 | Zhang et al. |
| 2016/0381818 A1 | 12/2016 | Mills et al. |
| 2017/0126539 A1 | 5/2017 | Tiwari et al. |

FOREIGN PATENT DOCUMENTS

| | | |
|---|---|---|
| CN | 105425060 A | 3/2016 |
| TW | 200908868 A | 2/2009 |
| TW | 200918914 A | 5/2009 |
| TW | 201040351 A | 11/2010 |
| WO | 2009092695 A1 | 7/2009 |
| WO | 2014137012 A1 | 9/2014 |

OTHER PUBLICATIONS

Office Action from related Chinese patent application No. 201710447241.4, dated May 31, 2019, 9 Pages.
Second Office Action from related Chinese patent application No. 201710447241.4, dated Feb. 3, 2020, 22 pages.
Office Action from related Taiwanese patent application No. 106119654, dated Feb. 6, 2018, 11 pp.

\* cited by examiner

APPARATUS AND METHODS FOR TESTING DEVICES

PRIORITY INFORMATION

This application is a continuation of U.S. application Ser. No. 15/606,109, filed on May 26, 2017, which will issue as U.S. Pat. No. 10,718,805 on Jul. 21, 2020, which claims benefit of U.S. Provisional Application No. 62/349,939 filed Jun. 14, 2016, the specification of which is incorporated herein by reference.

TECHNICAL FIELD

The present disclosure relates generally to testing devices, and more particularly, to testing devices by measuring signals emitted by a device.

BACKGROUND

Devices, such as electronic devices used during computing operations, can be tested to determine whether the devices emit signals that may interfere with other devices. Devices can emit electromagnetic signals and/or radio frequency signals. Devices can be designed so the electromagnetic signals and/or radio frequency signals are at a level that does not interfere with the operation of other devices.

Test equipment can be used to measure signals emitted from devices under test. Test equipment can include computing equipment and circuitry to operate a device under test and measure electromagnetic signals and/or radio frequency signals emitted by a device under test. When testing devices for electromagnetic signal and/or radio frequency signal emissions, the devices can be isolated from the emissions of electromagnetic signal and/or radio frequency signals from other devices, but the test is still subject to emissions from the equipment performing the test. Tests using unshielded test equipment can include results that may not be accurate due to test measurements including electromagnetic signal and/or radio frequency signal emissions from the unshielded test equipment.

DETAILED DESCRIPTION

Figure 1:
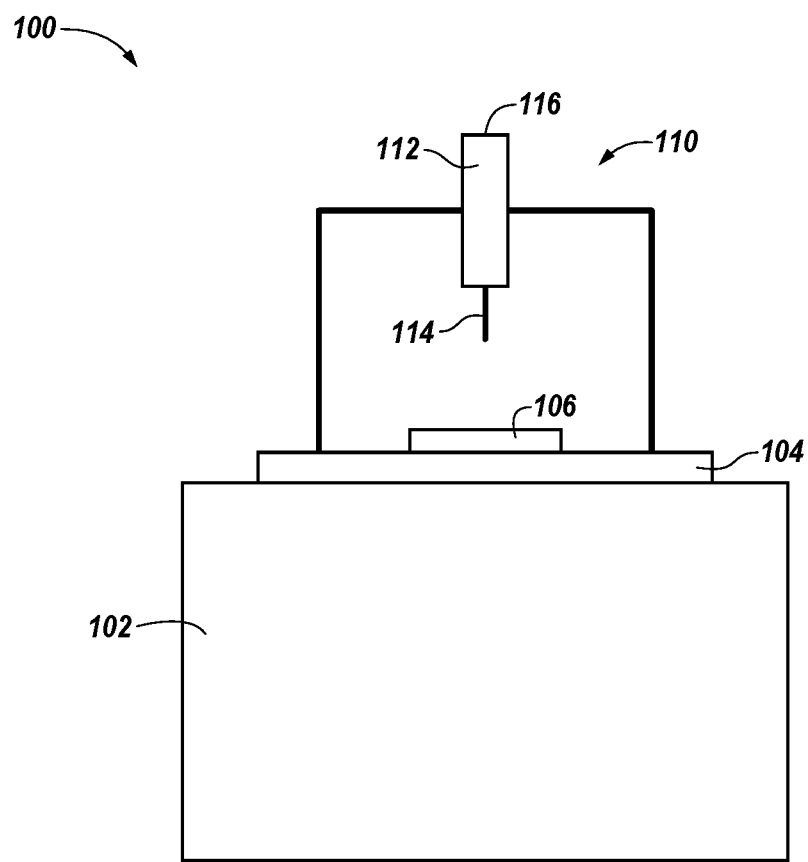
FIG. 1 is a block diagram of an electromagnetic compatibility (EMC) test apparatus in accordance with a number of embodiments of the present disclosure.

The present disclosure includes apparatuses and methods related to test devices, for example testing devices by measuring signals emitted by a device. One example apparatus can include a first portion including a number of sidewalls positioned to at least partially surround a device under test; and a second portion electrically coupled to the first portion, wherein the second portion is configured to move in the x-direction, the y-direction, and z-direction.

In a number of embodiments, a test enclosure can surround a device under test. The test enclosure can include an antenna coupled to a connector. The antenna can be configured to move in the x, y, and z directions within the test enclosure. The antenna and/or connector can be coupled to a positioning system that includes motors mounted on a gantry frame to move the antenna. The test enclosure can act as a Faraday style enclosure to block emissions from outside of the test enclosure, including emissions from automated test equipment. The antenna of the test enclosure can be configured to measure emissions (e.g., signals) from a device under test.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something can refer to one or more of such things. For example, a number of memory devices can refer to one or more of memory devices. Additionally, designators such as "X" and "Z", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 is a block diagram of an electromagnetic compatibility (EMC) test apparatus 100 in accordance with a number of embodiments of the present disclosure. In FIG. 1, EMC test apparatus 100 includes automatic test equipment 102 and test board 104. Automatic test equipment 102 and test board 104 can include computing equipment and circuitry to apply signals to operate a device under test 106. The device under test 106 can be coupled to the automatic test equipment 102 and/or test board 104 and receive signals from the automatic test equipment 102 while performing a test on the device under test 106. A device under test 106 can include a number of types of electrical devices. The electrical devices can include packaged electrical devices and/or combinations of packaged electrical devices. For example, the electrical device can include processors (e.g., x86, micro FPGA, and RISC), memory devices (e.g., DRAM, NAND, and NOR), power devices, ASIC devices, memory modules (e.g., DIMM), hard drives, SSD (solid state drives), single function cards (e.g., graphics cards, network cards, and audio cards), among other types of electrical devices.

The EMC test apparatus 100 can include test enclosure 110. Test enclosure 110 can be physically and/or electrically coupled to the automatic test equipment 102 and/or test board 104. The test enclosure 110, including the sidewalls and upper portions, can be formed of a conductive material, such as metal, for example. Electrically coupling the test enclosure 110 to the automatic test equipment 102 and/or test board 104 can allow the test enclosure 110 to provide a Faraday style enclosure, e.g., a Faraday cage, for the device under test 106. Test enclosure 110 can be configured to conduct electrical charges. The test enclosure 110 can block signals, such as electromagnetic emissions and/or radio frequency signals, from entering the test enclosure 110.

Test enclosure 110 can include a number of sidewalls and/or a number of upper portions to surround the portions of the device under test 106 that are not coupled to the automatic test equipment 102 and/or test board 104. The test enclosure 110 can be configured to physically and electrically isolate a device under test 106 from signals that are generated outside of the test enclosure 110.

In a number of embodiments, test enclosure 110 can be configured to be coupled to various EMC test apparatuses. Therefore, a test enclosure 100 can be portable and used in various test environments that include automated test equipment. A test enclosure 110 can be used with a various different types of automated test equipment.

Test enclosure 110 can also include a connector 112, antenna 114 and cable 116. Connector 112 can be physically and/or electrically coupled to an upper portion of the test enclosure 110. Connector 112 can be coupled to antenna 114 and cable 116. The antenna 114 can be configured to measure signals (e.g., near field (NF) electromagnetic interference (EMI) and/or radio frequency (RF) noise) emitted by the device under test 106. The test enclosure 110 can be configured to block signals generated outside of the test enclosure 110 (e.g., signals generated by the automatic test equipment 102 and/or the electric motors that move the antenna within the test enclosure 110, for example, among other sources), so that the antenna 114 is measuring signals generated by the device under test 106 and not signals generated from other sources.

Test enclosure 110 can be configured so that antenna 114 can move in the x, y, and z directions within the test enclosure 110. The antenna 114 can move within the test enclosure 110 to make measurements of signals emitted by the device under test 106 at a number of locations within the test enclosure 100. Connector 112, which is coupled to antenna 114, can be coupled to a number of motors mounted to a gantry frame to move the connector 112 and antenna 114 in the x, y, and z directions.

Figure 2A:
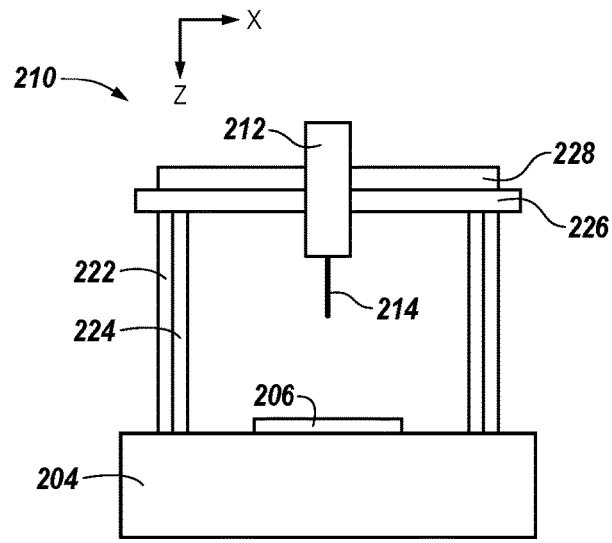
FIGS. 2A-2D are a block diagrams of a portion of an electromagnetic compatibility (EMC) test apparatus including a test enclosure in accordance with a number of embodiments of the present disclosure.

FIGS. 2A-2D are diagrams of a portion of an electromagnetic compatibility (EMC) test apparatus including a test enclosure 210 in accordance with a number of embodiments of the present disclosure. FIG. 2A is a cross-sectional side view of test enclosure 210. Test enclosure 210 can include a number of first sidewalls 222 and a number of second sidewalls 224. The number of first sidewalls 222 and/or the number of second sidewalls 224 can enclose each side of a device under test 206, wherein the device under test 206 is enclosed on all 360° surrounding the device under test 206. The number of first sidewalls 222 and/or the number of second sidewalls 224 can each include 4 sidewalls forming a rectangle and/or square, for example. The number of first sidewalls 222 and/or the number of second sidewalls 224 can each include 1 sidewall, where the number of first sidewalls 222 and/or the number of second sidewalls 224 are cylinders, for example.

The number of first sidewalls 222 can be electrically coupled to the number of second sidewalls 224 and can be configured so the number of first sidewalls 222 can move in the z direction (e.g., vertically) in relation to the number of second sidewalls 224. The number of second sidewalls 224 can be coupled electrically and/or physically to test board 204 and the number of first sidewalls 222 can be configured to move in the z direction, while maintaining an electrical connection with the number of second sidewalls 224, allowing antenna 214 to move to various vertical positions within the test enclosure.

The test enclosure 210 can include a first upper portion 226 that can be electrically and/or physically coupled to the number of first sidewalls 224. The first upper portion 226 can be coupled to the number of first sidewalls via a coupling mechanism such as conductive tape, solder, and/or a conductive clamp, for example, among other coupling mechanisms. A second upper portion 228 can be electrically and/or physically coupled to the first upper portion 226. The first upper portion 226 can be coupled to second upper portion 228 via a coupling mechanism such as conductive tape, solder, and/or a conductive clamp, for example, among other coupling mechanisms. The first upper portion 226 and/or second upper portion 228 can enclose an area above the device under test 206. A connector 212 can be electrically and/or physically coupled to the second upper portion 228 and antenna can be coupled to connector 212. First upper portion 226 can include an opening (e.g., opening 230 in FIG. 2B) and the second upper portion 228 can be configure to move in the x and y directions while maintaining an electrical connection to the first upper portion 226. The second upper portion 228 can be configured to move in the x and y directions, thus moving the connector 212 and antenna 214 in the x and y directions so that antenna 114 can be move to various positions in the x and y directions within the opening in the first upper portion 226.

Figure 2B:
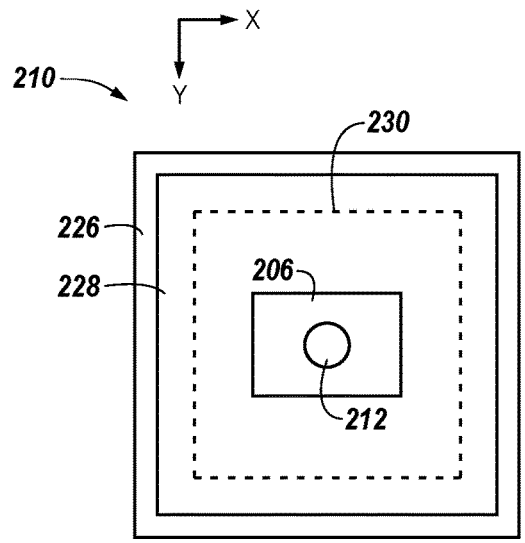

FIG. 2B is a top view of test enclosure 210 in accordance with embodiments of the present disclosure. Test enclosure 210 can include a first upper portion 226. First upper portion 226 can be coupled physically and electrically to a number of sidewall of the test enclosure 210 (e.g., a number of first sidewalls 222 and a number of second sidewalls 224 in FIG. 2A). First upper portion 226 can include an opening 230.

Test enclosure 210 can include a second upper portion 228. Second upper portion 228 can be coupled physically and electrically to first upper portion 226. Second upper portion 228 can be configured to move in the x and y directions with respect to the first upper portion 226 while maintaining an electrical connection with the first upper portion 226. Connector 212 can be physically and/or electrically connected to the second upper portion 228 and antenna 214 can be physically and/or electrically connected to connector 212. The second upper portion 228, along with the connector 212 and antenna 212, can be configured to move in the x and y directions within opening 230 of the first upper portion 226 so the antenna can measure signals from the device under test 206 at various positions within the test enclosure 210.

Figure 2C:
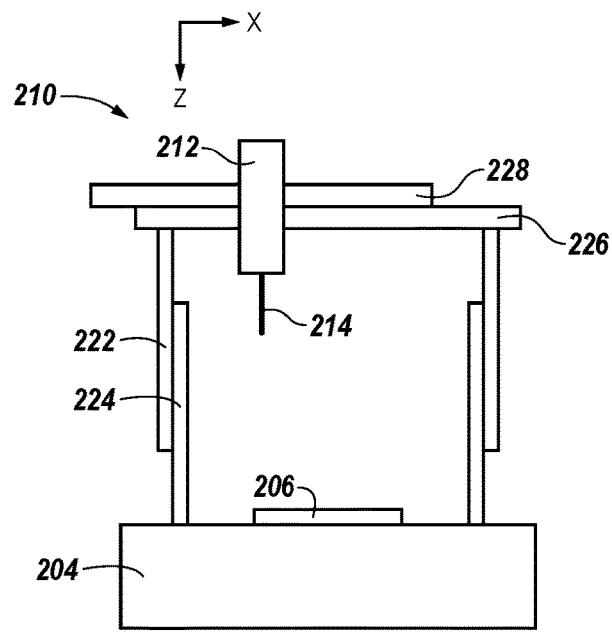

FIG. 2C is a side view of test enclosure 210 illustrating movement of antenna 214 in the x and z directions in accordance with embodiments of the present disclosure. In FIG. 2C, antenna 214 is shown moved in the z direction away from the device under test 206 in relation to the position shown in FIG. 2A. Antenna 214 can be configured to move in the z direction by moving the number of first sidewalls 222 in relation to the number of second sidewalls 224. Antenna 214 is coupled via connector 212 to the second upper portion 228, which is coupled to the first upper portion 226, which is coupled to the number of first sidewalls 222, allowing antenna 214 to move in the z direction when the number of first sidewalls 222 are moved in the z direction.

In FIG. 2C, antenna 214 is shown moved in the x direction to the left of the device under test 206 in relation to the position shown in FIG. 2A. Antenna 214 can be configured to move in the x direction by moving the second upper portion 228 in relation to first upper portion 226. Antenna 214 is coupled to the second upper portion 228 via connector 212, allowing antenna 214 to move in the x direction when the second upper portion 228 is moved in the x direction. Movement in the x direction can be limited by an opening in the first upper portion 226 where antenna 214 can move between a first side of an opening and a second side of the opening (e.g., opening 230 in FIG. 2B).

Figure 2D:
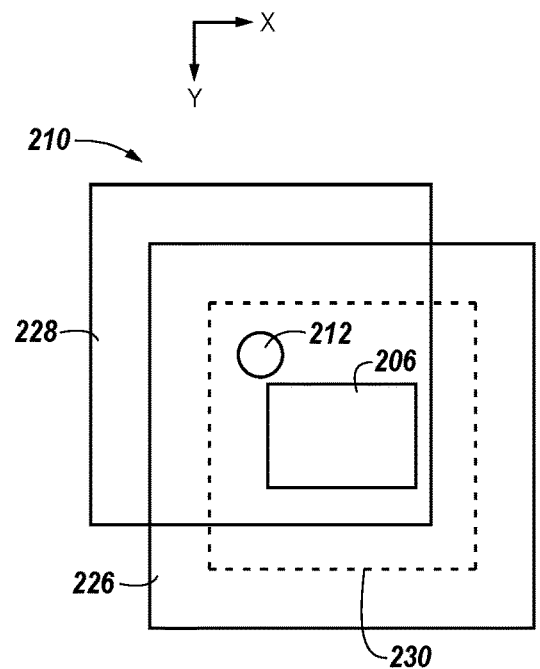

FIG. 2D is a top view of test enclosure 210 illustrating movement of antenna 214 in the x and y directions in accordance with embodiments of the present disclosure. In FIG. 2D, connector 212 is shown moved in the x direction to the left of the device under test 206 and in the y direction from the device under test 206 in relation to the position shown in FIG. 2A. Antenna (not shown) is coupled to the second upper portion 228 via connector 212, allowing antenna 214 to move in the x and y directions when the second upper portion 228 is moved in the x and y directions. Movement in the x and y directions can be limited by an opening in the first upper portion 226, where antenna 214 can move between a first side of an opening and a second side of the opening in the x direction and between a third side and a fourth side of the opening in the y direction (e.g., opening 230 in FIG. 2B).

Figure 3A:
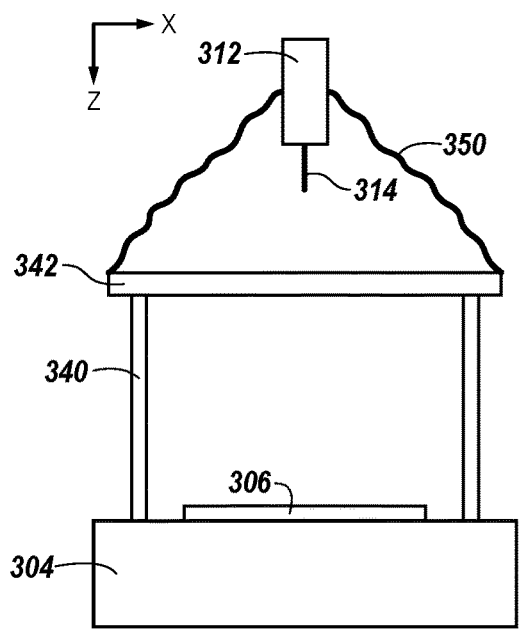
FIGS. 3A-3D are a block diagrams of a portion of an electromagnetic compatibility (EMC) test apparatus including a test enclosure in accordance with a number of embodiments of the present disclosure.

FIGS. 3A-3D are diagrams of a portion of an electromagnetic compatibility (EMC) test apparatus including a test enclosure 310 in accordance with a number of embodiments of the present disclosure. FIG. 3A is a cross-sectional side view of test enclosure 310. Test enclosure 310 can include a number of sidewalls 340. The number of sidewalls 340 can enclose each side of a device under test 306, wherein the device under test 306 is enclosed on all 360° surrounding the device under test 306. The number of sidewalls 340 can include 4 sidewalls forming a rectangle and/or square, for example. The number of sidewalls 340 can include 1 sidewall, where the number of sidewalls 340 are cylinders, for example. The number of sidewalls 340 can be coupled electrically and/or physically to test board 304.

The test enclosure 310 can include an upper portion 350 that can be electrically and/or physically coupled to the number of sidewalls 340 via coupling mechanism 342. The coupling mechanism 342 can be conductive tape, solder, and/or a conductive clamp, for example, among other coupling mechanisms. The upper portion 350 can enclose an area above the device under test 306. A connector 312 can be electrically and/or physically coupled to the upper portion 350 and antenna can be coupled to connector 312. Upper portion 350 can be formed of electrically conductive fabric and allow the connector 312 and antenna 314 to move in the x, y, and z directions while maintaining an electrical connection to the number of sidewalls 340. The upper portion 350 allows the connector 312 and antenna 314 to move in the x, y, and z directions so that antenna 314 can be move to various positions in the x and y directions within the test enclosure 310.

Figure 3B:
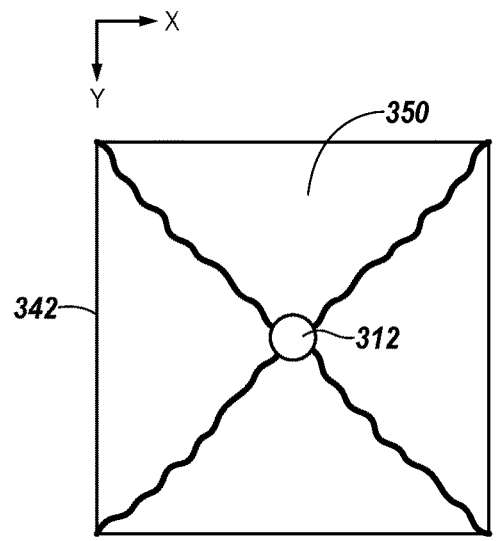

FIG. 3B is a top view of test enclosure 310 in accordance with embodiments of the present disclosure. Test enclosure 310 can include an upper portion 350. Upper portion 350 can be coupled physically and electrically to a number of sidewalls of the test enclosure 310 (e.g., a number of sidewalls 340 in FIG. 3A).

Connector 312 can be physically and/or electrically connected to the upper portion 350 and antenna 314 can be physically and/or electrically connected to connector 312. The upper portion 350, along with the connector 312 and antenna 314, can be configured to move in the x, y, and z directions so the antenna 314 can measure signals from the device under test 306 at various positions within the test enclosure 310.

Figure 3C:
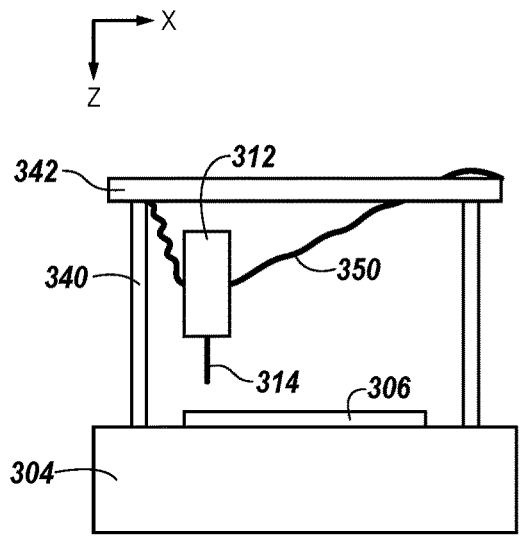

FIG. 3C is a cross-sectional side view of test enclosure 310 illustrating movement of antenna 314 in the x and z directions in accordance with embodiments of the present disclosure. In FIG. 3C, antenna 314 is shown moved in the z direction toward the device under test 306 in relation to the position shown in FIG. 3A. Antenna 314 can be configured to move in the z direction by moving the upper portion 350. Antenna 314 is coupled via connector 312 to the upper portion 350, allowing antenna 314 to move in the z direction. In FIG. 3C, antenna 314 is shown moved in the x direction to the left of the device under test 306 in relation to the position shown in FIG. 3A. Connector 312 can be coupled to a positioning system. A positioning system can include a number of motors coupled to a gantry frame to move the connector 312 and antenna 314 in the x, y, and z, directions.

Figure 3D:
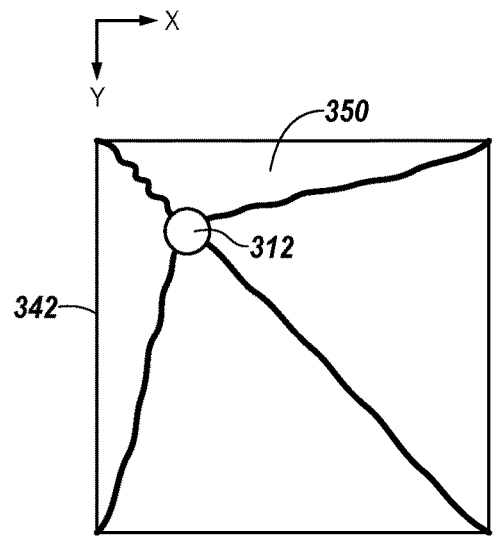

FIG. 3D is a top view of test enclosure 310 illustrating movement of antenna 314 in the x and y directions in accordance with embodiments of the present disclosure. In FIG. 3D, connector 312 is shown moved in the x direction to the left of the device under test 306 and in the y direction from the device under test 206 in relation to the position shown in FIG. 3A. Antenna (not shown) is coupled to the upper portion 350 via connector 312, allowing antenna 314 to move in the x and y directions via a positioning system.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
 a first portion including a number of sidewalls positioned to at least partially surround a device under test; and
 a second portion electrically coupled to the first portion, wherein the second portion is configured to move in the x-direction, the y-direction, and z-direction, wherein second portion is comprised of an electrically conductive fabric; and a connector coupled to an antenna, wherein the connector is coupled to the second portion and wherein the connector and antenna are configured to move in the x-direction, y-direction, and z-direction within the apparatus.

2. The apparatus of claim 1, wherein conductive tape electrically couples the first portion to the second portion.

3. The apparatus of claim 1, wherein the upper surface of the first portion is electrically coupled to the second portion via a metallic gasket.

4. The apparatus of claim 1, wherein the first portion is soldered to the second portion to electrically couple the first portion to the second portion.

5. The apparatus of claim 1, wherein an antenna is coupled to the second portion to measure electromagnetic interference (EMI) and/or radio frequency (RF) noise from the device under test within the apparatus.

6. An apparatus, comprising:

a first portion including a number of sidewalls positioned to at least partially surround a device under test;

a second portion having a number of sidewalls positioned to at least partially surround the first portion and the device under test, wherein the number of sidewalls of the second portion are electrically coupled to the first portion and configured to move in the z-direction with respect to the number of sidewalls of the first portion;

a third portion positioned on an upper surface of the second portion, wherein the third portion is electrically coupled to second portion and the third portion includes an opening;

a fourth portion position on an upper surface of the third portion, wherein the fourth portion is electrically coupled to the third portion and the fourth portion is configured to move in the x-direction and the y-direction with respect to the upper surface of the third portion; and an antenna coupled to the fourth portion.

7. The apparatus of claim 6, wherein the first portion, the second portion, the third portion, and the fourth portion surround the device under test and block electromagnetic signals and radio frequency signals that are outside of the first portion, the second portion, the third portion, and fourth portion.

8. The apparatus of claim 6, wherein the upper surface of the second portion is electrically coupled to the third portion via a metallic gasket.

9. The apparatus of claim 6, wherein the antenna is configured to move in the x and y direction within the opening.

10. The apparatus of claim 6, wherein an antenna is coupled to the fourth portion via a connector and is configured to measure electromagnetic signals and radio frequency signals emitted by the device under test.

11. The apparatus of claim 6, wherein the first portion is electrically coupled to a test board and the device under test is coupled to the test board.

12. The apparatus of claim 6, wherein the device under test is configured to receive signals from an automatic test equipment a via a test board.

13. An apparatus, comprising:

a first portion coupled to a second portion, wherein the first portion is configured to move in the z-direction with respect to the second portion, wherein the first portion includes a number of sidewalls positioned to surround the second portion and a device under test and wherein the second portion includes a number of sidewalls position to surround the device under test;

a third portion electrically coupled to the first portion; and an antenna coupled to the third portion, wherein the third portion and antenna are configured to move in the x-direction and the y-direction with respect to the first portion, wherein the third portion is positioned on the upper surface of the fourth portion.

14. The apparatus of claim 13, wherein the third portion is electrically coupled to a fourth portion comprising an opening and wherein the third portion and the antenna are configured to move within the opening of the fourth portion.

15. The apparatus of claim 13, wherein the third portion is configured to move in the x-direction via a first motor and wherein moving the third portion is configured to move in the y direction via a second motor.

16. The appartus of claim 15, wherein the first portion is configured to move in the z direction via a third motor.

17. The apparatus of claim 13, wherein the antenna is configured to sense signals emitted by the device under test.

18. The apparatus of claim 17, wherein the antenna is configured to send the signals emitted by the device under test to automatic test equipment.

\* \* \* \* \*